United States Patent
Sun et al.

[11] Patent Number: 6,058,124
[45] Date of Patent: May 2, 2000

[54] MONOLITHIC INDEPENDENTLY ADDRESSABLE RED/IR SIDE BY SIDE LASER

[75] Inventors: Decai Sun, Sunnyvale; Ross D. Bringans, Cupertino, both of Calif.

[73] Assignee: Xerox Corporation, Stamford, Conn.

[21] Appl. No.: 08/976,845

[22] Filed: Nov. 25, 1997

[51] Int. Cl.[7] .................................................. H01S 3/085
[52] U.S. Cl. .................................. 372/46; 372/50; 372/23
[58] Field of Search .................................. 372/50, 46, 45, 372/23, 43, 48; 438/34

[56] References Cited

U.S. PATENT DOCUMENTS

| | | | |
|---|---|---|---|
| 5,319,655 | 6/1994 | Thornton | 372/23 |
| 5,384,797 | 1/1995 | Welch et al. | 372/23 |
| 5,386,428 | 1/1995 | Thornton et al. | 372/50 |
| 5,465,263 | 11/1995 | Bour et al. | 372/23 |
| 5,742,631 | 4/1998 | Paoli | 372/50 |
| 5,764,676 | 6/1998 | Paoli et al. | 372/50 |
| 5,805,630 | 9/1998 | Valster et al. | 372/50 |
| 5,917,847 | 6/1999 | Sun | 372/50 |

OTHER PUBLICATIONS

D.P. Bour et al., "Infra–red AlGaAs and visible AlGaInP laser–diode stack", *Electronics Letters*, vol. 29, No. 21, Oct. 14, 1993, pp. 1855–1856.

R. S. Geels et al., "Dual spot visible laser diodes", *Electronics Letters*, vol. 28, No. 15, Jul. 16, 1992, pp. 1460–1462.

J. S. Major et al., "Individually Addressable, High Power Singlemode Laser Diodes at 0.8, 0.85 and 0.92 $\mu$m", *Electronics Letters*, vol. 28, No. 4, Feb. 13, 1992, pp. 391–393.

*Primary Examiner*—James W. Davie
*Attorney, Agent, or Firm*—William Propp

[57] ABSTRACT

A monolithic laser structure has an infrared laser structure side by side with a red laser structure. The infrared and red laser structures share the same substrate and have the same material for the cladding layers and for the cap and barrier reduction layers. The red and infrared laser structures can have native oxide confined or metal confined ridge waveguides.

14 Claims, 7 Drawing Sheets

MONOLITHIC INDEPENDENTLY ADDRESSABLE RED/IR SIDE BY SIDE LASER

BACKGROUND OF THE INVENTION

This invention relates to a monolithic red and infrared wavelength dual laser structure and, more particularly, to a red laser structure and an infrared laser structure side by side laser array where the cladding layers of both the red and infrared laser structures are fabricated from the same semiconductor materials.

Addressable monolithic multi-wavelength light sources, especially laser arrays that can simultaneously emit different wavelength light from different elements in the array are useful in a variety of applications, such as color printing, full color digital film recording, color displays, and other optical recording system applications.

The performance of many devices, such as laser printers and optical memories, can be improved by the incorporation of multiple laser beams. For example, laser printers which use multiple beams can have higher printing speeds and/or better spot acuity than printers which use only a single beam.

In many applications, closely spaced laser beams of different wavelengths are desirable. For example, color printers which use closely spaced laser beams of different wavelengths can overlap the beams, sweep those overlapping beams using a single raster output polygon scanner and a single set of optics, subsequently separate the individual beams using color selective filters, direct each beam onto a separate xerographic imaging station, develop a latent image for each color on a different recording medium, and produce a full color image by sequentially developing each latent image on a single recording medium.

One way to obtain closely spaced laser beams is to form multiple laser emission sites, or laser stripes, on a common substrate. While this enables very closely spaced beams, prior art monolithic laser arrays typically output laser beams at only one wavelength.

Various techniques are known in the prior art for producing different wavelength laser beams from a monolithic laser array. For example, it is well known that a small amount of wavelength difference can be obtained by varying the drive conditions at each lasing region. However, the easily achievable but small wavelength difference is insufficient for most applications.

One method of achieving larger wavelength separations is to grow a first set of active layers on a substrate to form a first lasing element which outputs light at one wavelength, and then to grow a second set of active layers next to the first to form a second lasing element at a second wavelength.

Side by side monolithic laser arrays can not only output closely spaced laser beams of different wavelengths, but beneficially the output laser beams are aligned and their polarization axes are parallel or perpendicular to the lines joining the two lasers.

In printing systems applications, the requirements for red/ir side by side laser structures are (1) accurate lateral spacing of 50 microns or less with zero or minimum vertical spacing between the side by side laser structures, (2) the red and IR laser structures, although closely spaced side by side, are independently addressable, (3) low thermal or electrical cross-talk between the side by side laser structures, (4) a single transverse mode for light emission from both the red and IR laser structures, (5) fast switching of less than 3 nanoseconds and (6) long lifetime for the red/ir side by side laser structures.

It is an object of this invention to provide side by side red/ir laser structures in a monolithic structure capable of outputting closely spaced, multiple wavelength laser beams.

SUMMARY OF THE INVENTION

The present invention provides a monolithic laser structure having an infrared laser structure side by side with a red laser structure. The infrared and red laser structures share the same substrate and have the same material for the cladding layers and for the cap and barrier reduction layers. The red and infrared laser structures can have native oxide confined or metal confirmed ridge waveguides.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
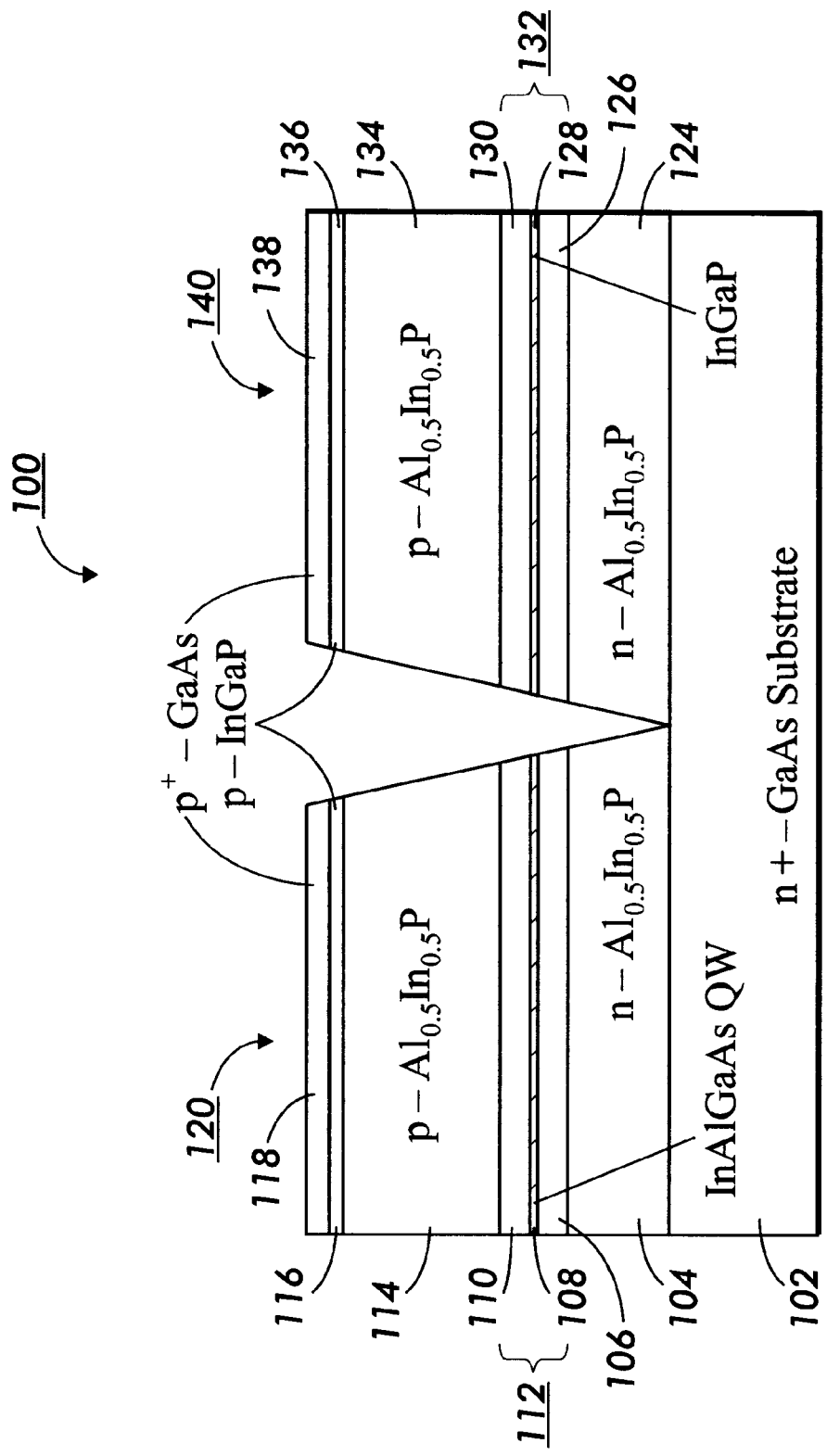
FIG. 1 is a cross-sectional side view of the semiconductor layers of the Red/IR side by side laser structure of the present invention.

Reference is now made to FIG. 1 which illustrates a first embodiment of the Infrared/Red side by side monolithic laser structure 100 in accordance to the present invention.

As shown in FIG. 1, an n-type $Al_{0.5}In_{0.5}P$ lower cladding layer 104 is grown on an n-type GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 104 range from 50 percent and 1 to $5 \times 10^{18}$ $cm^{-3}$ respectively. The thickness of the AlInP cladding layer 104 is approximately one micron ($\mu m$). The doping level of the n-type GaAs substrate 102 is approximately $5 \times 10^{18}$ $cm^{-3}$ or higher.

An undoped $Al_{0.4}Ga_{0.6}As$ lower confinement layer 106 is deposited on the cladding layer 104. The lower confinement layer 106 has an aluminum content of about 40% and a thickness of about 120 nanometers. After this lower confinement layer 106 has been deposited, an $In_{0.15}Al_{0.15}Ga_{0.7}As$ active layer 108 is deposited. The active layer 108 should emit light at approximately 835 nanometers. The active layer 108 may be a single quantum well, a multiple quantum well, or a layer with thickness greater than that of a quantum well. The thickness of a quantum well typically ranges from five to twenty nanometers and in this example is 8 nanometers. Upon the active layer 108 is deposited an undoped $Al_{0.4}Ga_{0.6}As$ upper confinement layer 110. The aluminum content of this confinement layer 110 is typically 40% and a thickness of about 120 nanometers. The lower and upper confinement layers, 106 and 110, together with the active layer 108, form the active region 112 for a laser structure with a lower threshold current and a smaller optical divergence.

After the upper confinement layer 110 has been formed, a p-type $Al_{0.5}In_{0.5}P$ upper cladding layer 114 of about one micron thickness is deposited. Typically, this cladding layer 114 has an aluminum content of 50% and a magnesium doping level of $5 \times 10^{18}$ $cm^{-3}$. Upon the upper p-type $A_{0.5}In_{0.5}P$ cladding layer 114 is deposited a barrier reduction $Ga_{0.5}In_{0.5}P$ layer 116, which typically has an aluminum composition of 40%, a thickness of 50 nanometers, and a magnesium doping level of approximately $5 \times 10^{18}$ $cmn^{-3}$. Upon this barrier reduction GaInP layer 116 is deposited a p+-GaAs cap layer 118, which typically is 100 nanometers thick with a magnesium doping of $1 \times 10^{19}$ $cm^{-3}$.

These semiconductor layers 102 to 118 form the infrared laser structure 120.

The laser structure 100 of FIG. 1 with the epitaxially deposited infrared laser structure 120 is then covered with a silicon nitride ($SiN_x$) or silicon oxide ($SiO_x$) layer (not shown). Stripe windows are then opened in the silicon nitride or oxide layer by photolithography and plasma etching. The stripe windows (not shown) are 300 microns wide with 500 micron spacing. Wet chemical etching with citric acid ($C_6H_8O_7:H_2O$):hydrogen dioxide ($H_2O_2$) and bromine acid (HBr) is then used to etch away the infrared laser structure 120 layers of cap layer 118, barrier reduction layer 116, upper cladding layer 114, upper confinement layer 110, active layer 108, lower confinement layer 106 and lower cladding layer 104 in the window region down to the n-GaAs substrate 102. The red laser structure will then be grown on the substrate in the window region. Once the red laser structure has been deposited, the silicon nitride or oxide layer on top of the remaining infrared laser structure 120 will be removed by plasma etching.

An n-type $Al_{0.5}In_{0.5}P$ lower cladding layer 124 is deposited on the n-type GaAs substrate 102. The aluminum mole fraction and doping level of the lower cladding layer 124 range from 50 percent and 1 to $5 \times 10^{18}$ $cm^{-3}$ respectively. The thickness of the AlInP cladding layer 124 is approximately one micron ($\mu m$).

An undoped $In_{0.5}(Al_{0.6}Ga_{0.4})_{0.5}P$ lower confinement layer 126 is deposited on the lower cladding layer 124. The lower confinement layer 126 has an aluminum content of about 30% and a thickness of about 120 nanometers. After this lower confinement layer 126 has been deposited, an $In_{0.6}Ga_{0.4}P$ active layer 128 is deposited. The active layer 128 will emit light at approximately 670 nanometers. The active layer 128 may be a single quantum well, a multiple quantum well, or a layer with thickness greater than that of a quantum well. The thickness of a quantum well typically ranges from five to twenty nanometers and in this example is 8 nanometers. Upon the active layer 128 is deposited an undoped $In_{0.5}(Al_{0.6}Ga_{0.4})_{0.5}P$ upper confinement layer 130. The aluminum content of this confinement layer 130 is typically 30% and a thickness of about 120 nanometers. The lower and upper confinement layers, 126 and 130, together with the active layer 128, form an active region 132 for a laser structure with a lower threshold current and a smaller optical divergence.

After the upper confinement layer 130 has been formed, a p-type $Al_{0.5}In_{0.5}P$ upper cladding layer 134 of about one micron thickness is deposited. Typically, this cladding layer 134 has an aluminum content of 50% and a magnesium doping level of $5 \times 10^{18}$ $cm^{-3}$. Upon the upper p-type $Al_{0.5}In_{0.5}P$ cladding layer 134 is deposited a barrier reduction $Ga_{0.5}In_{0.5}P$ layer 136, which typically has an aluminum composition of 40%, a thickness of 50 nanometers, and a magnesium doping level of approximately $5 \times 10^{18}$ $cm^{-3}$. Upon this barrier reduction GaInP layer 136 is deposited a p+-GaAs cap layer 138, which typically is 100 nanometers thick with a magnesium doping of $1 \times 10^{19}$ $cm^{-3}$.

These semiconductor layers 102 and 124 to 138 form the red laser structure 140.

The infrared laser structure 120 and the red laser structure 140 have the same substrate 102. The upper and lower cladding layers and the barrier reduction and cap layers for the infrared laser structure 120 and the red laser structure 140 are the same semiconductor materials with the same thicknesses and the same doping or nondoping. Since the upper and lower confinement layers and the active layers of the infrared laser structure 120 and the red laser structure 140 are the same thickness (although different semiconductor materials), the active regions for light emission of the two laser structures 120 and 140 within the laser structure 100 are the same height and parallel. Similarly, the electrode contacts for the infrared laser structure 120 and the red laser structure 140 on the cap layers 118 and 138 will be the same height and parallel.

The infrared laser structure 120 and the red laser structure 140 of the side by side laser structure 100 can have accurate lateral spacing of 50 microns or less with zero or minimum vertical spacing between the side by side laser structures.

Figure 2:
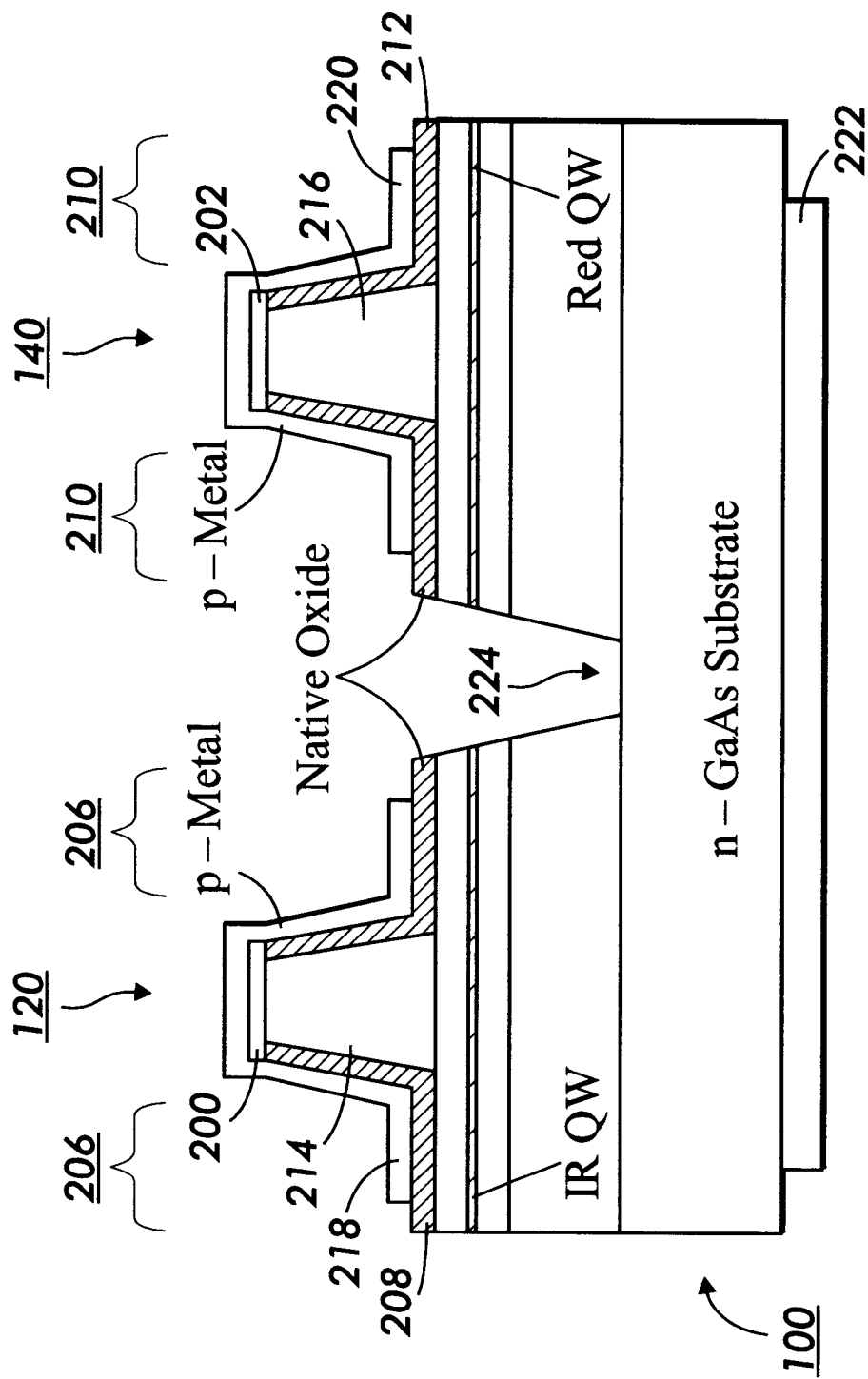
FIG. 2 is a cross-sectional side view of the semiconductor layers of the first embodiment of the Red/IR side by side laser structure with a native oxide confined waveguide of the present invention.

Oxide-confined waveguides can be fabricated for the IR/Red side by side laser structure 100 of FIG. 2.

After all the semiconductor layers of the semiconductor structure 100 shown in FIG. 1 have been deposited, a silicon nitride ($SiN_x$) or silicon oxide ($SiO_2$) layer is deposited on the upper surface of the cap layer 118 of the infrared laser structure 120 and on the upper surface of the cap layer 138 of the red laser structure 140 in FIG. 2. Dual stripes of 50 micron spacing are patterned on the cap layers 118 and 138 leaving open windows between the stripes.

A mixed bromine methanol ($Br:CH_3OH$) solution etches through the unmasked portions of the cap layer 118 and barrier reduction layer 116 of the infrared laser structure 120 leaving a small mesa 200 of masked, and thus unetched, cap layer 118 and barrier reduction layer 116 between the open window grooves.

The mixed bromine methanol ($Br:CH_3OH$) solution also etches through the unmasked portions of the cap layer 138 and barrier reduction layer 136 of the red laser structure 140 leaving a small mesa 202 of masked, and thus unetched, cap layer 138 and barrier reduction layer 136 between the open window grooves.

Phosphoric acid ($H_3PO_4$) then etches the unmasked portions of the 1 micron thick p-type $Al_{0.5}In_{0.5}P$ upper cladding layer 114 on either side of the mesa 200 down to a 0.35 micron thick p-type $Al_{0.5}In_{0.5}P$ upper cladding layer 114 above the active region 112 of layers 110, 108 and 106 using a timed etching technique.

The phosphoric acid ($H_3PO_4$) also etches the unmasked portions of the 1 micron thick p-type $Al_{0.5}In_{0.5}P$ upper cladding layer 134 on either side of the mesa 202 down to a 0.35 micron thick p-type $Al_{0.5}In_{0.5}P$ upper cladding layer 134 above the active region 132 of layers 130, 128 and 126 using a timed etching technique.

Reactive ion etching may be used in place of wet chemical etching.

After the thinning of the upper cladding layers 114 and 134 with the silicon nitride stripes remaining on the surface of the cap layers of the mesa 200 of the infrared laser structure 120 and the mesa 202 of the red laser structure 140, the semiconductor structure 100 undergoes a wet oxidation step. The structure is typically oxidized with water vapor in a nitrogen environment at elevated temperatures, in excess of 530° C. for approximately 4 hours.

During the oxidation process, the remaining $Al_{0.5}In_{0.5}P$ upper cladding layer 114 of the infrared laser structure 120 shown in FIG. 2 is exposed to the ambient through the open window grooves 206. Thus, the upper cladding layer 114, which comprises of AlInP with a high aluminum content, is oxidized radially outwards from each of the grooves into a native oxide ($AlO_x$) layer 208. The $Al_{0.5}In_{0.5}P$ upper cladding layer 114 outside the silicon nitride stripe is completely oxidized down to the upper confinement layer 110.

Similarly, during the oxidation process, the $Al_{0.5}In_{0.5}P$ upper cladding layer 134 of the red laser structure 140 shown in FIG. 2 is exposed to the ambient through the open window grooves 210. Thus, the upper cladding layer 134, which comprises of AlInP with a high aluminum content, is oxidized radially outwards from each of the grooves into a native oxide ($AlO_x$) layer 212. The $Al_{0.5}In_{0.5}P$ upper cladding layer 134 outside the silicon nitride stripe is completely oxidized down to the upper confinement layer 130.

Upon completion of oxidation as shown in FIG. 2, the silicon nitride stripes are removed. The native oxide layers 208 has been formed from the $Al_{0.5}P$ In 0.5 upper cladding layer 114 not covered by the silicon nitride strip and the native oxide layers 212 has been formed from the $Al_{0.5}In_{0.5}P$ upper cladding layer 134 not covered by the silicon nitride strip.

The remaining unoxidized $Al_{0.5}In_{0.5}P$ upper cladding layer 114 under the mesa 200 forms the ridge waveguide 214 for optical confinement of the light emitted from the active region of the infrared laser structure 120. The ridge waveguide 214 is confined by the native oxide layers 208.

The remaining unoxidized $Al_{0.5}In_{0.5}P$ upper cladding layer 134 under the mesa 202 forms the ridge waveguide 216 for optical confinement of the light emitted from the active region of the red laser structure 140. The ridge waveguide 216 is confined by the native oxide layers 212.

The ridge waveguides 214 and 216 are index-guided. The index of refraction of the native oxide layers 208 and 212 is approximately 1.6, the index of refraction of the active regions 112 and 132 is about 3.2 and the index of refraction of the AlInP ridge waveguide 214 and 216 is approximately 3.0. The differences in indices of refraction provide a strong optical confinement and electrical confinement of the light emitted by the active region by the ridge waveguide. The infrared laser structure 120 with its oxide confined ridge waveguide 214 and the red laser structure 140 with its oxide confined ridge waveguide 216 will each emit a single transverse mode light emission.

The native oxide regions 208 and 212 also improve the current confinement ability of the laser structure and severely limit current spreading between the two laser structures in the stack.

The boundaries between the active region, the ridge waveguide and the native oxide layers are relatively smooth and sharp as they are defined by an epitaxial growth process and a photolithography process. The spacing between the oxide regions 208 and 212 are controlled by using a photolithography mask and etch process. Since the photolithography process has a high degree of accuracy, the spacing between the oxide regions 208 and 212 can be minimal. Also, since these oxidized regions are defined after the epitaxial process has been completed, this approach allows for a high degree of process flexibility.

After the oxidation process and the removal of the silicon nitride stripes, a Ti—Au p-contact 218 can be deposited on the upper surface of the cap layer 118 and the native oxide layer 208 for the infrared laser structure 120. A Ti—Au p-contact 220 can be deposited on the upper surface of the cap layer 138 and the native oxide layer 212 for the red laser structure 140. An Au:Ge n-contact 222 can be deposited on the bottom surface of the substrate 102, common to both the infrared laser structure 120 and the red laser structure 140.

The IR and red laser structures, although closely spaced side by side, are independently addressable with fast switching of less than 3 nanoseconds.

An isolation groove 224 is etched between the infrared laser structure 118 and the red laser structure 138 down to the substrate 102 to provide electrical and thermal isolation between the two laser structures in order to reduce crosstalk between the two laser structures.

The IR/Red side by side laser structure 100 of FIG. 2 is an edge emitting array. Conventional facets (not shown) are provided on the edge of the laser structure 100. The infrared laser structure 120 will emit light of infrared wavelength from the active region 112 including the active layer 108 through the edge of the laser structure. The red laser structure 120 will emit light of red wavelength from the active region 132 including the active layer 128 through the edge of the laser structure.

Figure 3:
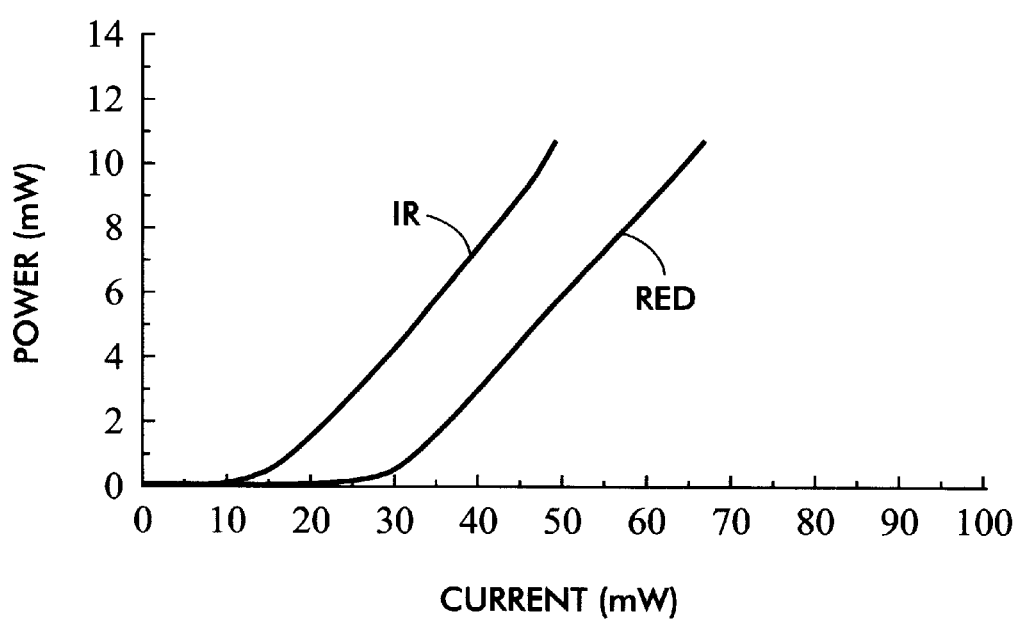
FIG. 3 is a graph for the power versus current of the infrared laser structure and the red laser structure of the Red/IR side by side laser structure with a native oxide confined waveguide of FIG. 2.

The IR/Red side by side laser structure 100 of FIG. 2 also will have a long lifetime. The graph of FIG. 3 for the power versus current of the infrared laser structure 120 and the red laser structure 140 of the Red/IR side by side laser structure 100 with a native oxide confined waveguide of FIG. 2 shows that the threshold currents are 10 mA and 27 mA for the IR and red laser structures, respectively.

The native oxide layers also provide good heat dissipation. The native oxide layers have excellent thermal conductance of 30 W/K m, which is five times better than the AlInP of the cladding layer and waveguide and twice higher than that of GaAs cap layer. Since the laser elements have low threshold and high efficiency, the thermal cross-talk among adjacent laser diodes is expected to be small.

Another benefit of using $Al_{0.5}In_{0.5}P$ alloy for the cladding layer is that AlInP has a much larger bandgap that AlGaAs. Infrared lasers with AlInP cladding layers will have a smaller leakage current at higher operating temperatures than all AlGaAs lasers.

Figure 4:
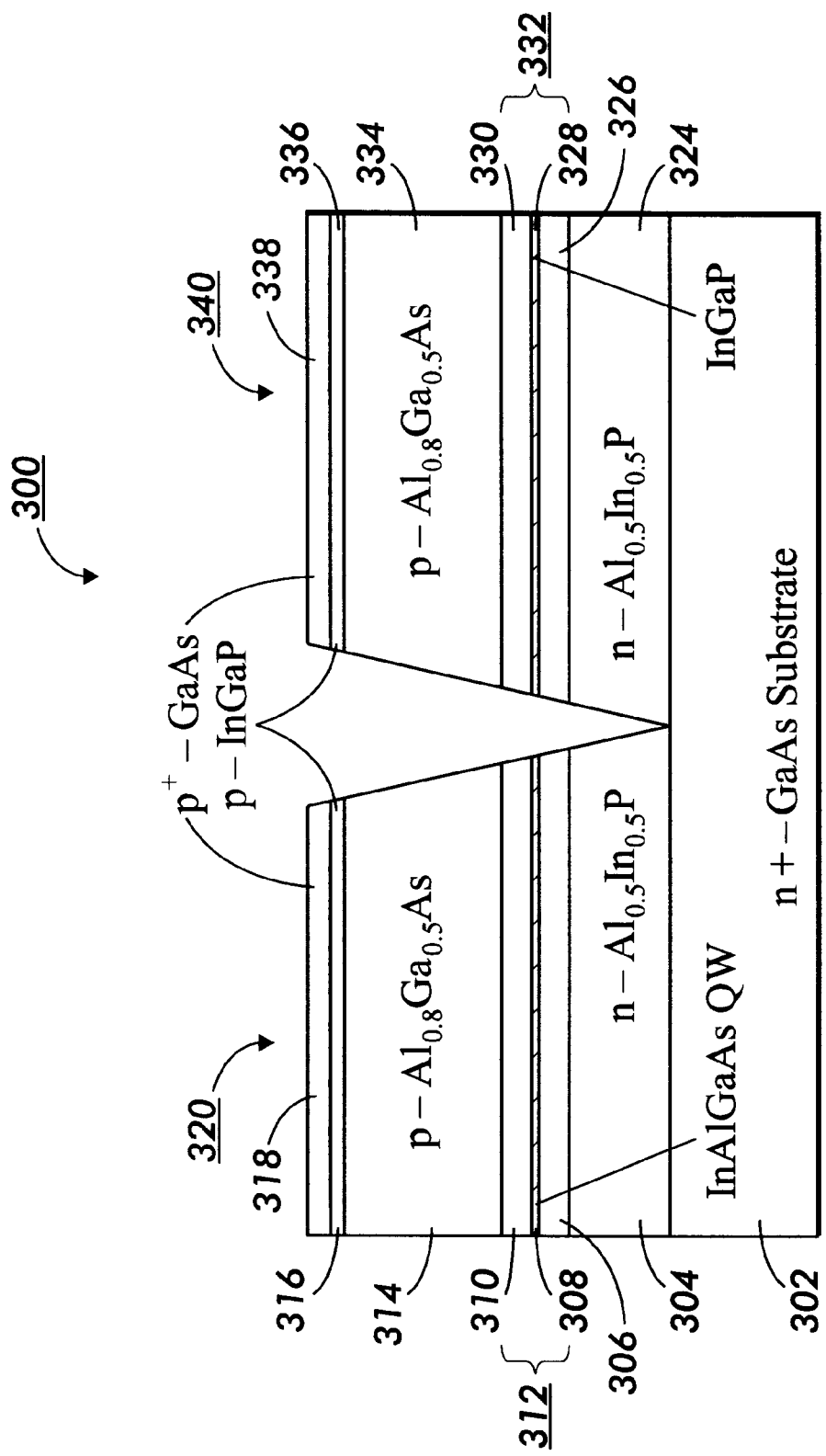
FIG. 4 is a cross-sectional side view of the semiconductor layers of another Red/IR side by side laser structure of the present invention.

Reference is now made to FIG. 4 which illustrates another Infrared/Red side by side monolithic laser structure 300 in accordance to the present invention.

As shown in FIG. 4, an n-type $Al_{0.8}Ga_{0.2}As$ lower cladding layer 304 is grown on an n-type GaAs substrate 302 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 304 range from 80 percent and 1 to $5 \times 10^{18}$ cm$^{-3}$ respectively. The thickness of the AlGaAs cladding layer 304 is approximately one micron ($\mu$m). The doping level of the n-type GaAs substrate 302 is approximately $5 \times 10^{18}$ cm$^{-3}$ or higher.

An undoped $Al_{0.4}Ga_{0.6}As$ lower confinement layer 306 is deposited on the cladding layer 304. The lower confinement layer 306 has an aluminum content of about 40% and a thickness of about 120 nanometers. After this lower confinement layer 326 has been deposited, an $In_{0.15}Al_{0.15}Ga_{0.7}As$ active layer 308 is deposited. The active layer 308 should emit light at approximately 835 nanometers. The active layer 308 may be a single quantum well, a multiple quantum well, or a layer with thickness greater than that of a quantum well. The thickness of a quantum well typically ranges from five to twenty nanometers and in this example is 8 nanometers. Upon the active layer 308 is deposited an undoped $Al_{0.4}Ga_{0.6}As$ upper confinement layer 310. The aluminum content of this confinement layer 310 is typically 40% and a thickness of about 120 nanometers. The lower and upper confinement layers, 306 and 310, together with the active layer 308, form the active region 312 for a laser structure with a lower threshold current and a smaller optical divergence.

After the upper confinement layer 310 has been formed, a p-type $Al_{0.8}Ga_{0.2}As$ upper cladding layer 314 of about one micron thickness is deposited. Typically, this cladding layer 314 has an aluminum content of 80% and a magnesium doping level of $5 \times 10^{18}$ cm$^{-3}$. Upon the upper p-type $Al_{0.8}Ga_{0.2}As$ cladding layer 314 is deposited a barrier reduction $Al_{0.4}Ga_{0.6}As$ layer 316, which typically has an aluminum composition of 40%, a thickness of 50 nanometers, and a magnesium doping level of approximately $5 \times 10^{18}$ cm$^{-3}$. Upon this barrier reduction AlGaAs layer 316 is deposited a p+-GaAs cap layer 318, which typically is 100 nanometers thick with a magnesium doping of $1 \times 10^{19}$ cm$^{-3}$.

These semiconductor layers 302 to 318 form the infrared laser structure 320.

The laser structure 300 of FIG. 4 with the epitaxially deposited infrared laser structure 320 is then covered with a silicon nitride (SiN$_x$) or silicon oxide (SiO$_x$) layer (not shown). Stripe windows are then opened in the silicon nitride or oxide layer by photolithography and plasma etching. The stripe windows (not shown) are 300 microns wide with 500 micron spacing. Wet chemical etching with sulfuric acid (H$_2$SO$_4$):hydrogen dioxide (H$_2$O$_2$) and bromine acid (HBr) is then used to etch away the infrared laser structure 320 layers of cap layer 318, barrier reduction layer 316, upper cladding layer 314, upper confinement layer 310, active layer 308, lower confinement layer 306 and lower cladding layer 304 in the window region down to the n-GaAs substrate 302. The red laser structure will then be grown on the substrate in the window region. Once the red laser structure has been deposited, the silicon nitride or oxide layer on top of the remaining infrared laser structure 320 will be removed by plasma etching.

An n-type $Al_{0.5}In_{0.5}P$ lower cladding layer 324 is deposited on the n-type GaAs substrate 302. The aluminum mole fraction and doping level of the lower cladding layer 324 range from 50 percent and 1 to $5 \times 10^{18}$ cm$^{-3}$ respectively. The thickness of the AlInP cladding layer 324 is approximately one micron ($\mu$m).

An undoped $In_{0.5}(Al_{0.6}Ga_{0.4})_{0.5}P$ lower confinement layer 326 is deposited on the lower cladding layer 324. The lower confinement layer 326 has an aluminum content of about 30% and a thickness of about 120 nanometers. After this lower confinement layer 326 has been deposited, an $In_{0.6}Ga_{0.4}P$ active layer 328 is deposited. The active layer 328 will emit light at approximately 670 nanometers. The active layer 328 may be a single quantum well, a multiple quantum well, or a layer with thickness greater than that of a quantum well. The thickness of a quantum well typically ranges from five to twenty nanometers and in this example is 8 nanometers. Upon the active layer 328 is deposited an undoped $In_{0.5}(Al_{0.6}Ga_{o.4})_{0.5}P$ upper confinement layer 330. The aluminum content of this confinement layer 330 is typically 30% and a thickness of about 120 nanometers. The lower and upper confinement layers, 326 and 330, together with the active layer 328, form an active region 332 for a laser structure with a lower threshold current and a smaller optical divergence.

After the upper confinement layer 330 has been formed, a p-type $Al_{0.5}In_{0.5}P$ carrier confinement layer 133 is deposited. The $Al_{0.5}In_{0.5}P$ carrier confinement layer 133 helps confine the carriers from the red laser active region. The carrier confinement layer 133 has an aluminum content of 50%, a thickness of 100 nanometers and a magnesium doping level of $1 \times 10^{18}$. Upon the carrier confinement layer 133, a p-type $Al_{0.8}Ga_{0.2}As$ upper cladding layer 334 of about one micron thickness is deposited. Typically, this cladding layer 334 has an aluminum content of 80% and a magnesium doping level of $5 \times 10^{18}$ cm$^{-3}$. Upon the upper p-type $Al_{0.8}Ga_{0.2}As$ cladding layer 334 is deposited a barrier reduction $Al_{0.4}Ga_{0.6}As$ layer 336, which typically has an aluminum composition of 40%, a thickness of 50 nanometers, and a magnesium doping level of approximately $5 \times 10_{18}$ cm$^{-3}$. Upon this barrier reduction AlGaAs layer 336 is deposited a p+-GaAs cap layer 338, which typically is 100 nanometers thick with a magnesium doping of $1 \times 10^{19}$ cm$^{-3}$.

These semiconductor layers 302 and 324 to 338 form the red laser structure 340.

The infrared laser structure 320 and the red laser structure 340 have the same substrate 302. The upper cladding layers for the infrared laser structure 320 and the red laser structure 340 are the same semiconductor materials with the same thicknesses and the same doping or nondoping. The lower cladding layers of the infrared laser structure 320 and the red laser structure 340 are the same thickness (although different semiconductor materials). Since the upper and lower confinement layers and the active layers of the infrared laser structure 320 and the red laser structure 340 are the same thickness (although different semiconductor materials), the active regions for light emission of the two laser structures 320 and 340 within the laser structure 300 are the same height and parallel. Similarly, the electrode contacts for the infrared laser structure 320 and the red laser structure 340 on the cap layers 318 and 338 will be the same height and parallel.

The infrared laser structure 320 and the red laser structure 340 of the side by side laser structure 300 can have accurate lateral spacing of 50 microns or less with zero or minimum vertical spacing between the side by side laser structures.

Figure 5:
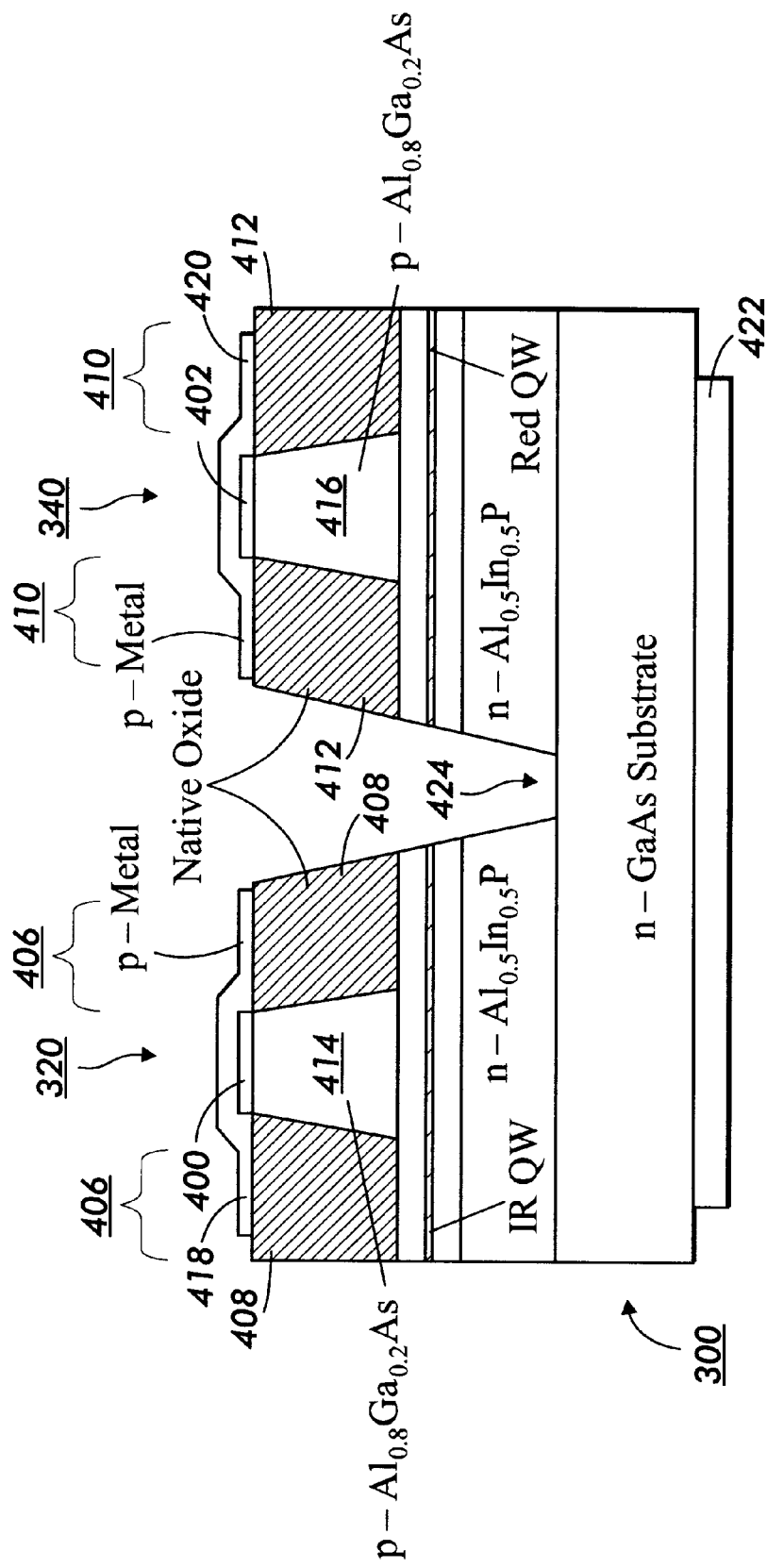
FIG. 5 is a cross-sectional side view of the semiconductor layers of the second embodiment of the Red/IR side by side laser structure with a native oxide confined waveguide of the present invention.

Oxide-confined waveguides can be fabricated for the IR/Red side by side laser structure 300 of FIG. 5.

After all the semiconductor layers of the semiconductor structure 300 shown in FIG. 4 have been deposited, a silicon nitride (SiN$_x$) or silicon oxide (SiO$_2$) layer is deposited on the upper surface of the cap layer 318 of the infrared laser structure 320 and on the upper surface of the cap layer 338 of the red laser structure 340 in FIG. 5. Dual stripes of 50 micron spacing are patterned on the cap layers 318 and 338 leaving open windows between the stripes.

A mixed bromine methanol (Br:CH$_3$OH) solution etches through the unmasked portions of the cap layer 318 and barrier reduction layer 316 of the infrared laser structure 320 leaving a small mesa 400 of masked, and thus unetched, cap layer 318 and barrier reduction layer 316 between the open window grooves.

The mixed bromine methanol (Br:CH$_3$OH) solution also etches through the unmasked portions of the cap layer 338 and barrier reduction layer 336 of the red laser structure 340 leaving a small mesa 402 of masked, and thus unetched, cap layer 338 and barrier reduction layer 336 between the open window grooves.

With the silicon nitride stripes remaining on the surface of the cap layers of the mesa 400 of the infrared laser structure 320 and the mesa 402 of the red laser structure 340, the semiconductor structure 300 undergoes a wet oxidation step. The structure is typically oxidized with water vapor in a nitrogen environment at elevated temperatures, in excess of 450° C. for approximately 2 hours.

During the oxidation process, the Al$_{0.8}$Ga$_{0.2}$As upper cladding layer 314 of the infrared laser structure 320 shown in FIG. 5 is exposed to the ambient through the open window grooves 406. Thus, the upper cladding layer 314, which comprises of AlGaAs with a high aluminum content, is oxidized radially outwards from each of the grooves into a native oxide layer 408. The Al$_{0.8}$Ga$_{0.2}$As upper cladding layer 314 outside the silicon nitride stripe is completely oxidized down to the upper confinement layer 310.

Similarly, during the oxidation process, the Al$_{0.8}$Ga$_{0.2}$As upper cladding layer 334 of the red laser structure 340 shown in FIG. 5 is exposed to the ambient through the open window grooves 410. Thus, the upper cladding layer 334, which comprises of AlGaAs with a high aluminum content, is oxidized radially outwards from each of the grooves into a native oxide layer 412. The Al$_{0.8}$Ga$_{0.2}$As upper cladding layer 334 outside the silicon nitride stripe is completely oxidized down to the carrier confinement layer 133.

Upon completion of oxidation as shown in FIG. 5, the silicon nitride stripes are removed. The native oxide layers 408 has been formed from the Al$_{0.8}$Ga$_{0.2}$As upper cladding layer 314 not covered by the silicon nitride strip and the native oxide layers 412 has been formed from the Al$_{0.8}$Ga$_{0.2}$As upper cladding layer 334 not covered by the silicon nitride strip.

The remaining unoxidized Al$_{0.8}$Ga$_{0.2}$As upper cladding layer 314 under the mesa 400 forms the ridge waveguide 414 for optical confinement of the light emitted from the active region of the infrared laser structure 320. The ridge waveguide 414 is confined by the-native oxide layers 408.

The remaining unoxidized Al$_{0.8}$Ga$_{0.2}$As upper cladding layer 332 under the mesa 402 forms the ridge waveguide 416 for optical confinement of the light emitted from the active region of the red laser structure 340. The ridge waveguide 416 is confined by the native oxide layers 412.

The infrared laser structure 320 with its oxide confined ridge waveguide 414 and the red laser structure 340 with its oxide confined ridge waveguide 416 will each emit a single transverse mode light emission.

After the oxidation process and the removal of the silicon nitride stripes, a Ti—Au p-contact 418 can be deposited on the upper surface of the cap layer 318 and the native oxide layer 408 for the infrared laser structure 320. A Ti—Au p-contact 420 can be deposited on the upper surface of the cap layer 338 and the native oxide layer 412 for the red laser structure 340. An Au:Ge n-contact 422 can be deposited on the bottom surface of the substrate 302, common to both the infrared laser structure 320 and the red laser structure 340.

An isolation groove 424 is etched between the infrared laser structure 318 and the red laser structure 338 down to the substrate 302 to provide electrical and thermal isolation between the two laser structures in order to reduce crosstalk between the two laser structures.

The IR/Red side by side laser structure 300 of FIG. 5 is an edge emitting array. Conventional facets (not shown) are provided on the edge of the laser structure 300. The infrared laser structure 320 will emit light of infrared wavelength from the active region 312 including the active layer 308 through the edge of the laser structure. The red laser structure 320 will emit light of red wavelength from the active region 332 including the active layer 328 through the edge of the laser structure.

Figure 6:
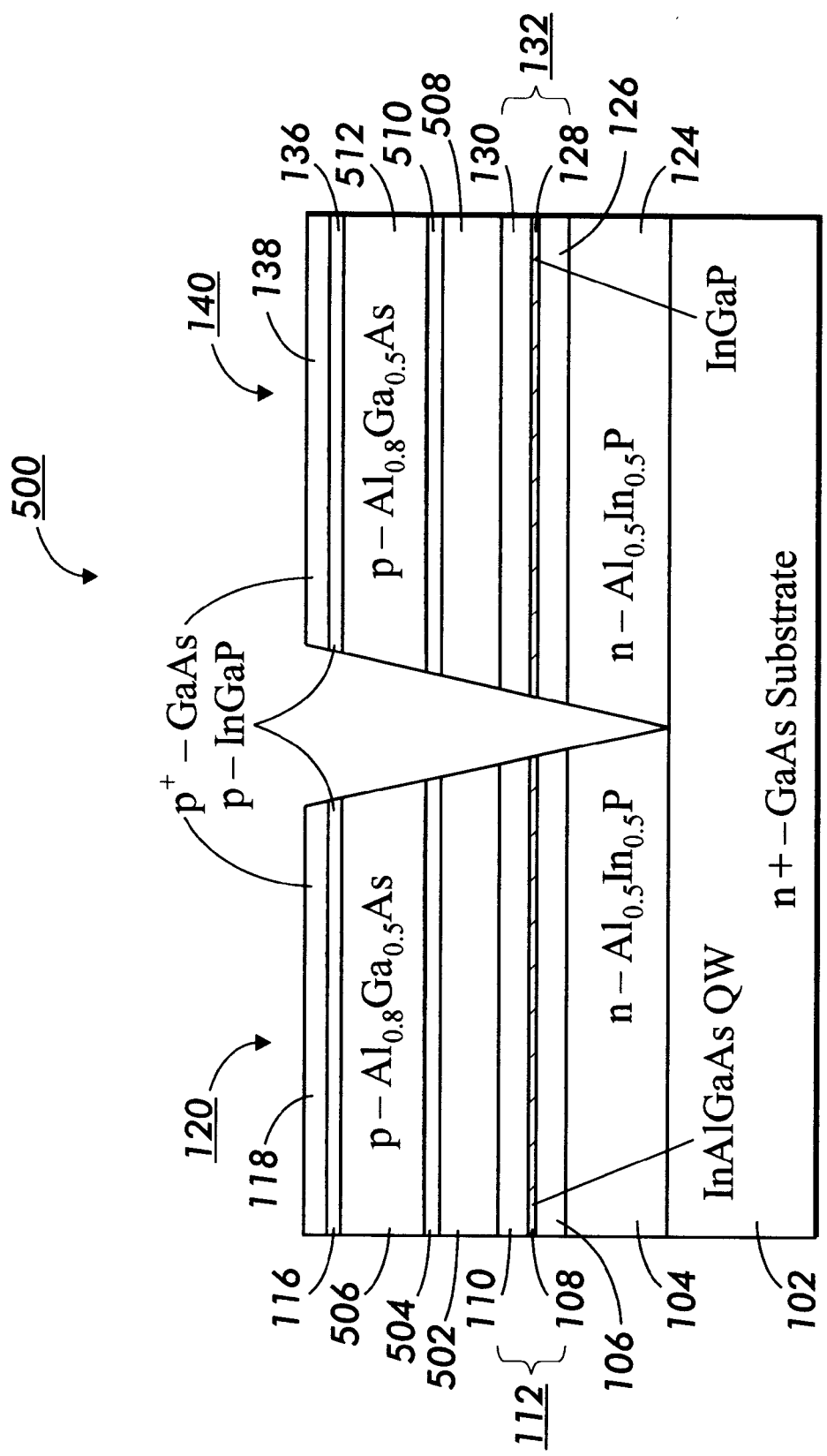
FIG. 6 is a cross-sectional side view of the semiconductor layers of another Red/IR side by side laser structure of the present invention.

Reference is now made to FIG. 6 which illustrates another Infrared/Red side by side monolithic laser structure 500 in accordance to the present invention.

The laser structure 500 of FIG. 6 has the same semiconductor layers as the laser structure 100 of FIG. 1 except for the upper cladding layer 114 in the infrared laser structure 120 and the upper cladding layer 134 in the red laser structure 140.

In the laser structure 500 of FIG. 6, between the upper confinement layer 110 and the barrier reduction layer 116 is deposited an alternate upper cladding layer. Upon the upper confinement layer 110 in the infrared laser structure 120 is deposited a first Al$_{0.5}$In$_{0.5}$P upper cladding layer 502 of about 200 nanometers thickness. Typically, this first upper cladding layer 502 has an aluminum content of 50% and a magnesium doping level of 5×10$^{18}$ cm$^{-3}$. Upon the first upper p-type Al$_{0.5}$In$_{0.5}$P cladding layer 502, an In$_{0.5}$Ga$_{0.5}$P etch stop layer 504 of about 10 nanometers thickness is deposited. The doping level of the etch stop layer 504 is 1 to 5×10$^{18}$ cm$^{-3}$. Upon the etch stop layer 504 is deposited the second Al$_{0.5}$In$_{0.5}$P upper cladding layer 506 of about 800 nanometers thickness. Typically, this second upper cladding layer 506 has an aluminum content of 50% and a magnesium doping level of 5×10$^{18}$ cm$^{-3}$. The barrier reduction layer 116 is deposited on the second upper cladding layer 506.

Similarly, in the laser structure 500 of FIG. 6, between the upper confinement layer 130 and the barrier reduction layer 136 is deposited an alternate upper cladding layer. Upon the upper confinement layer 130 in the red laser structure 140 is deposited a first Al$_{0.5}$In$_{0.5}$P upper cladding layer 508 of about 200 nanometers thickness. Typically, this first upper cladding layer 508 has an aluminum content of 50% and a magnesium doping level of 5×10$^{18}$ cm$^{-3}$. Upon the first upper p-type Al$_{0.5}$In$_{0.5}$P cladding layer 508, an In$_{0.5}$Ga$_{0.5}$P etch stop layer 510 of about 10 nanometers thickness is deposited. The doping level of the etch stop layer 510 is 1 to 5×10$^{18}$ cm$^{-3}$. Upon the etch stop layer 510 is deposited the second Al$_{0.5}$In$_{0.5}$P upper cladding layer 512 of about 800 nanometers thickness. Typically, this second upper cladding layer 512 has an aluminum content of 50% and a magnesium doping level of 5×10$^{18}$cm$^{-3}$. The barrier reduction layer 136 is deposited on the second upper cladding layer 512.

Metal clad ridge-waveguides can be fabricated for the IR/Red side by side laser structure 500 of FIG. 6.

Figure 7:
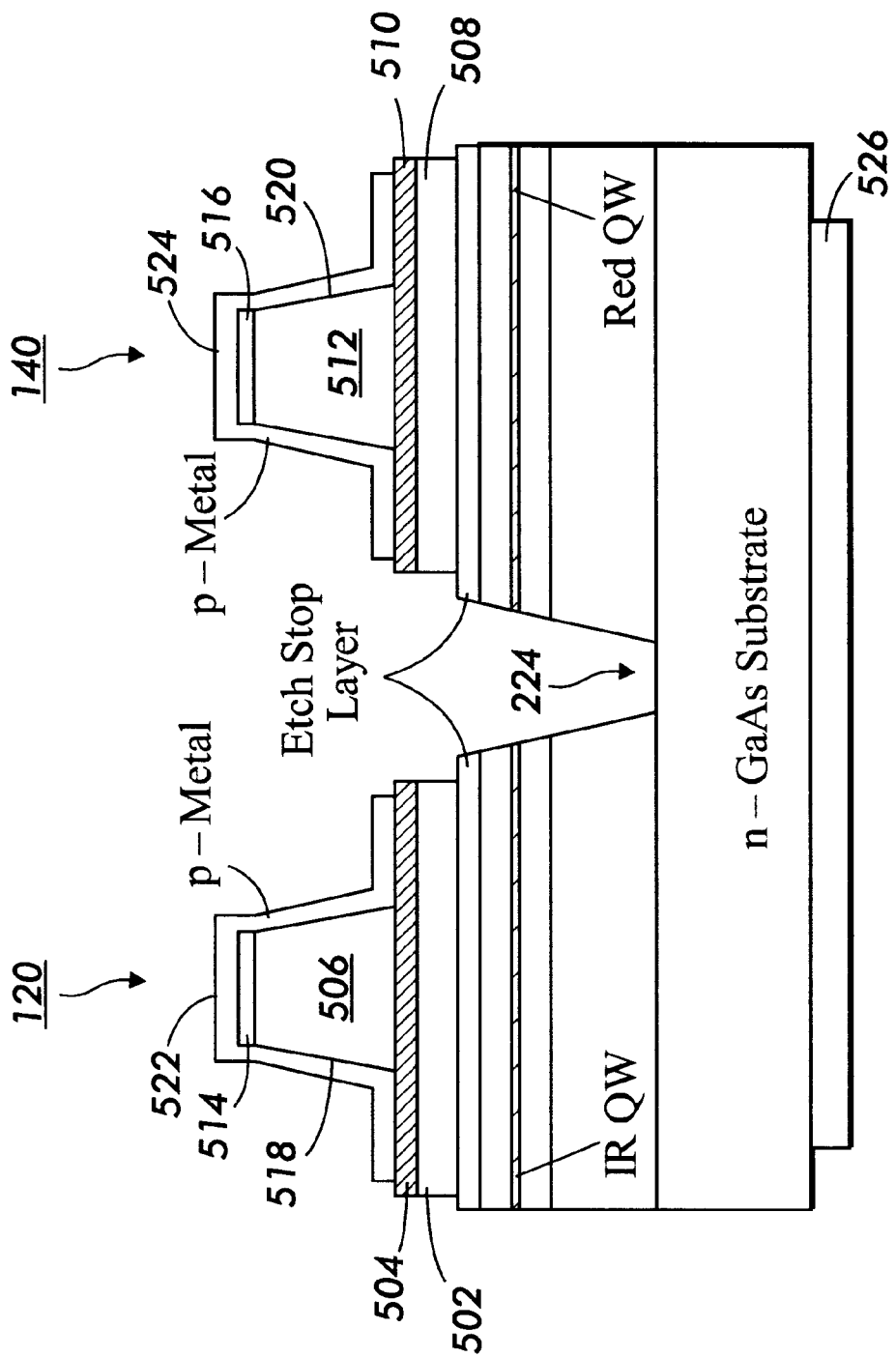
FIG. 7 is a cross-sectional side view of the semiconductor layers of the third embodiment of the Red/IR side by side laser structure with a metal clad ridge waveguide of the present invention.

After all the semiconductor layers of the semiconductor structure 500 shown in FIG. 6 have been deposited, a silicon nitride (SiN$_x$) or silicon oxide (SiO$_2$) layer is deposited on the upper surface of the cap layer 118 of the infrared laser structure 120 and on the upper surface of the cap layer 138 of the red laser structure 140 in FIG. 7. Dual stripes of 50 micron spacing are patterned on the cap layers 118 and 138 leaving open windows between the stripes.

A mixed bromine methanol (Br:CH$_3$OH) solution etches through the unmasked portions of the cap layer 118 and barrier reduction layer 116 of the infrared laser structure 120 leaving a small mesa 514 of masked, and thus unetched, cap layer 118 and barrier reduction layer 116 between the open window grooves.

The mixed bromine methanol (Br:CH$_3$OH) solution also etches through the unmasked portions of the cap layer 138 and barrier reduction layer 136 of the red laser structure 140 leaving a small mesa 516 of masked, and thus unetched, cap layer 138 and barrier reduction layer 136 between the open window grooves.

Phosphoric acid (H$_3$PO$_4$) then etches the unmasked portions of the 0.8 micron thick p-type Al$_{0.5}$In$_{0.5}$P second upper cladding layer 506 on either side of the mesa 514 down to the etch stop layer 504 above the active region 112.

The phosphoric acid (H$_3$PO$_4$) also etches the unmasked portions of the 0.8 micron thick p-type A$_{0.5}$In$_{0.5}$P second upper cladding layer 512 on either side of the mesa 516 down to the etch stop layer 510 above the active region 132.

Upon completion of etching as shown in FIG. 7, the silicon nitride stripes are removed.

The remaining unoxidized Al$_{0.5}$In$_{0.5}$P upper cladding layer 506 under the mesa 514 forms the ridge waveguide 518 for optical confinement of the light emitted from the active region of the infrared laser structure 120.

The remaining unoxidized Al$_{0.5}$In$_{0.5}$P upper cladding layer 512 under the mesa 516 forms the ridge waveguide 520 for optical confinement of the light emitted from the active region of the red laser structure 140.

After the oxidation process and the removal of the silicon nitride stripes, a Ti—Au p-contact 522 can be deposited on the upper surface of the cap layer 118, the second upper cladding layer 506 and the etch stop layer 504 for the infrared laser structure 120. The ridge waveguide 518 is confined by the metal p-contact 522. A Ti—Au p-contact 524 can be deposited on the upper surface of the cap layer 138, the second upper cladding layer 512 and the etch stop layer 510 for the red laser structure 140. The ridge waveguide 520 is confined by the metal p-contact 524. An Au:Ge n-contact 526 can be deposited on the bottom surface of the substrate 102, common to both the infrared laser structure 120 and the red laser structure 140.

The infrared laser structure 120 with its metal confined ridge waveguide 518 and the red laser structure 140 with its metal confined ridge waveguide 520 will each emit a single transverse mode light emission.

The IR and red laser structures, although closely spaced side by side, are independently addressable with fast switching of less than 3 nanoseconds.

The IR/Red side by side laser structure 500 of FIG. 7 is an edge emitting array. Conventional facets (not shown) are provided on the edge of the laser structure 500. The infrared laser structure 120 will emit light of infrared wavelength from the active region 112 including the active layer 108 through the edge of the laser structure. The red laser structure 140 will emit light of red wavelength from the active region 132 including the active layer 128 through the edge of the laser structure.

Alternately, in the third embodiment of the Infrared/Red side by side monolithic laser structure 500 of FIG. 7, the upper cladding layer and the lower cladding layer of the infrared laser structure 120 and the upper cladding layer and the lower cladding layer of the red laser structure 140 can be the semiconductor material (AlGa)$_{0.5}$In$_{0.5}$P.

The upper cladding layers of the infrared laser structure and the red laser structure in all the embodiments of the present invention must be the same material either a phosphide such as Al$_{0.5}$In$_{0.5}$P or an arsenide such as Al$_{0.8}$Ga$_{0.2}$As. The lower cladding layers may be the same material, either phosphide or arsenide, or can be different materials either two different arsenides, two different phosphides or a phosphide and an arsenide.

In the embodiments of the present invention, the infrared laser structure was grown first on the GaAs substrate followed by an etching and regrowth of the red laser structure. Alternately for this invention, the red laser structure can be grown first on the GaAs substrate followed by an etching and regrowth of the infrared laser structure.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A monolithic edge-emitting semiconductor laser structure comprising:
   a first laser structure having
      an n-type first substrate;
      an n-type first cladding layer of a first semiconductor material formed on said substrate;
      a first confinement layer, a first active layer for emitting light of an infrared wavelength, and a second confinement layer forming a first active region on said first cladding layer;
      a p-type second cladding layer of a second semiconductor material formed on said second confinement layer above said first active region;
      a first ridge waveguide formed from said second cladding layer, said first ridge waveguide providing optical confinement for light emission from said first active region, said first ridge waveguide being defined by native oxide layers being formed from said second cladding layer;
      a p-type first contact layer formed on said second cladding layer,
   a second laser structure having
      said n-type first substrate;
      an n-type third cladding layer of a third semiconductor material formed on said first substrate;
      a third confinement layer, a second active layer for emitting light of a red wavelength, and a fourth confinement layer forming a second active region on said third cladding layer;
      a p-type fourth cladding layer of said second semiconductor material formed on said fourth confinement layer above said second active region;

a second ridge waveguide formed from said fourth cladding layer, said second ridge waveguide providing optical confinement for light emission from said second active region, said second ridge waveguide being defined by native oxide layers being formed from said fourth cladding layer;

a p-type second contact layer formed on said fourth cladding layer, said first laser structure and said second laser structure being side by side on said first substrate, a first electrode and a second electrode which enable biasing of said first active region for emission of light of said infrared wavelength, and a third electrode and said second electrode which enable biasing of said second active region for emission of light of said red wavelength.

2. The monolithic edge-emitting semiconductor laser structure of claim 1 wherein said second semiconductor material is a phosphide.

3. The monolithic edge-emitting semiconductor laser structure of claim 2 wherein said first semiconductor material is a phosphide and said third semiconductor material is a phosphide.

4. The monolithic edge-emitting semiconductor laser structure of claim 2 wherein said first semiconductor material is an arsenide and said third semiconductor material is a phosphide.

5. The monolithic edge-emitting semiconductor laser structure of claim 2 wherein said first semiconductor material is a phosphide and said third semiconductor material is an arsenide.

6. The monolithic edge-emitting semiconductor laser structure of claim 1 wherein said second semiconductor material is an arsenide.

7. The monolithic edge-emitting semiconductor laser structure of claim 6 wherein said first semiconductor material is a phosphide and said third semiconductor material is a phosphide.

8. The monolithic edge-emitting semiconductor laser structure of claim 6 wherein said first semiconductor material is an arsenide and said third semiconductor material is a phosphide.

9. The monolithic edge-emitting semiconductor laser structure of claim 6 wherein said first semiconductor material is a phosphide and said third semiconductor material is an arsenide.

10. The monolithic edge-emitting semiconductor laser structure of claim 1 wherein said first substrate of said first laser structure is GaAs, said first and second cladding layers of said first laser structure are $Al_{0.5}In_{0.5}P$, said first and second confinement layers of said first laser structure are $Al_{0.4}Ga_{0.6}As$, said second active layer of said second laser structure is $In_{0.15}Al_{0.15}Ga_{0.7}As$, said second contact layer of said second laser structure is GaAs, said first substrate of said second laser structure is GaAs, said third and fourth cladding layers of said second laser structure are $Al_{0.5}In_{0.5}P$, said third and fourth confinement layers of said second laser structure are $In_{0.5}(Al_{0.6}Ga_{0.4})_{0.5}P$, said second active layer of said second laser structure is $Ga_{0.4}In_{0.6}P$, said second contact layer of said second laser structure is GaAs.

11. The monolithic edge-emitting semiconductor laser structure of claim 1 further comprising a first cap layer formed on said first contact layer of said first laser structure and a second cap layer formed on said second contact layer of said second laser structure and wherein said first electrode is on said first cap layer of said first laser structure, said second electrode is on said first substrate of said first laser structure and said third electrode is on said second cap layer of said second laser structure.

12. The monolithic edge-emitting semiconductor laser structure of claim 1 wherein said native oxide layers comprise a native oxide of an aluminum-containing semiconductor material.

13. The monolithic edge-emitting semiconductor laser structure of claim 1 wherein said first substrate of said first laser structure is GaAs, said first cladding layer of said first laser structure is $Al_{0.5}In_{0.5}P$, said second cladding layer of said first laser structure is $Al_{0.8}Ga_{0.2}As$, said first and second confinement layers of said first laser structure are $Al_{0.4}Ga_{0.6}As$, said second active layer of said second laser structure is $In_{0.15}Al_{0.15}Ga_{0.7}As$, said second contact layer of said second laser structure is GaAs, said first substrate of said second laser structure is GaAs, said third cladding layer of said second laser structure is $Al_{0.5}In_{0.5}P$, said fourth cladding layer of said first second structure is $Al_{0.8}Ga_{0.2}As$, said third and fourth confinement layers of said second laser structure are $In_{0.5}(Al_{0.6}Ga_{0.4})_{0.5}P$, said second active layer of said second laser structure is $Ga_{0.4}In_{0.6}P$, and said second contact layer of said second laser structure is GaAs.

14. The monolithic edge-emitting semiconductor laser structure of claim 13 wherein a p-type carrier confinement layer is deposited between said fourth confinement layer and said fourth cladding layer of said second laser structure.

* * * * *

UNITED STATES PATENT AND TRADEMARK OFFICE
CERTIFICATE OF CORRECTION

| | | |
|---|---|---|
| PATENT NO. | : 6,058,124 | |
| APPLICATION NO. | : 08/976845 | |
| DATED | : May 2, 2000 | |
| INVENTOR(S) | : Decai Sun et al. | |

It is certified that error appears in the above-identified patent and that said Letters Patent is hereby corrected as shown below:

Column 1, line 4, insert as a new paragraph:

This invention was made with Government support under Agreement No. 70NANB2H1241 awarded by the Department of Commerce. The Government has certain rights in this invention.

Signed and Sealed this

First Day of August, 2006

JON W. DUDAS
*Director of the United States Patent and Trademark Office*